United States Patent
Foote et al.

(10) Patent No.: US 7,416,910 B2
(45) Date of Patent: Aug. 26, 2008

(54) PYRAMID SOCKET SUSPENSION

(75) Inventors: Steven A. Foote, Issaquah, WA (US);
Paul H. Collins, Issaquah, WA (US); J. Christopher Milne, Issaquah, WA (US)

(73) Assignee: Honeywell International Inc., Morristown, NJ (US)

( * ) Notice: Subject to any disclaimer, the term of this patent is extended or adjusted under 35 U.S.C. 154(b) by 186 days.

(21) Appl. No.: 11/348,584

(22) Filed: Feb. 6, 2006

(65) Prior Publication Data

US 2006/0128048 A1    Jun. 15, 2006

(51) Int. Cl.
*H01L 21/00* (2006.01)
(52) U.S. Cl. .............................. 438/48; 438/15; 438/25; 438/26; 257/E33.056; 257/E23.001; 73/1.01
(58) Field of Classification Search .................. 438/48
See application file for complete search history.

(56) References Cited

U.S. PATENT DOCUMENTS

| | | | |
|---|---|---|---|
| 4,592,234 A | * | 6/1986 | Norling ........................ 73/497 |
| 5,007,290 A | * | 4/1991 | Egley et al. ............... 73/514.36 |
| 5,633,461 A | * | 5/1997 | Kakizaki et al. .............. 73/493 |
| 5,948,981 A | | 9/1999 | Woodruff |
| 6,257,060 B1 | | 7/2001 | Leonardson et al. |
| 6,301,966 B1 | | 10/2001 | Foote |

FOREIGN PATENT DOCUMENTS

WO    WO 03/066515 A2    8/2003

* cited by examiner

*Primary Examiner*—Walter Lindsay, Jr.
*Assistant Examiner*—Abdulfattah Mustapha (57) ABSTRACT

An apparatus and method for flexibly suspending a sensing mechanism between a pair of cover plates, including a sensing mechanism formed in a crystalline silicon substrate; a pair of cover plates formed in crystalline silicon substrates; a first plurality of complementary interfaces in fixed relation between the sensing mechanism and a first one of the cover plates; and a second plurality of complementary interfaces flexibly suspended between the sensing mechanism and a second one of the cover plates with one or more of the flexibly suspended interfaces being a complementary male and female interface.

10 Claims, 8 Drawing Sheets

PYRAMID SOCKET SUSPENSION

This application claims priority benefit of parent U.S. patent application Ser. No. 10/779,921 filed in the names of Steven A. Foote, et al. on Feb. 17, 2004, the complete disclosure of which is incorporated herein by reference.

FIELD OF THE INVENTION

The present invention relates to suspension devices and methods, and in particular to structures for mounting force-versus-displacement sensors in micro-machined electromechanical sensor (MEMS) devices, whereby external stress sources are isolated from active sensor components.

BACKGROUND OF THE INVENTION

Many different types of sensors are manufactured as micro-machined electromechanical system (MEMS) devices in different crystalline materials, including by example and without limitation, crystalline silicon and other crystalline materials that react similarly to conventional MEMS manufacturing techniques. One example of conventional MEMS manufacturing techniques is a silicon on insulator (SOI) process commonly used in the manufacture of sensors, particularly force-versus-displacement or "force/displacement" sensors for measurement of acceleration. Other MEMS devices are manufactured using an epitaxial wafer process and even sensors formed in undoped silicon wafers having no oxide growth at all.

For purposes of laying a background for the present invention, one typical example of a prior art (MEMS) device is provided to illustrate the common cantilever-style strain isolation device of the prior art.

Accelerometers generally measure acceleration forces applied to a body by being mounted directly onto a surface of the accelerated body. One common type of accelerometer produced using conventional MEMS manufacturing techniques employs one or more force-versus-displacement or "force/displacement" sensors for measurement of acceleration. Accelerometers employing two force/displacement sensors instead of the necessary minimum one sensor gain considerable advantage. If the two sensors operate in a push-pull mode, then many error sources such as thermally driven effects or drift may be rejected as common mode, while the difference signal represents the desired acceleration measurement. Occasionally, designs using two force/displacement sensors include two completely separate proof masses, which results in essentially two accelerometers, each having its own sensor, but operating in opposite directions. For numerous reasons, however, a two proof mass solution is not preferred. Rather, it is generally advantageous to have only one proof mass in an accelerometer.

Many different types of force/displacement accelerometers are manufactured as MEMS devices using conventional techniques. One typical example of a prior art MEMS device is a micromachined two-sensor/single proof mass accelerometer. By example and without limitation a MEMS accelerometer device, commonly referred to as a Rectangle design, is provided to illustrate the current state of the art.

FIGS. 1A, 1B, 1C and 1D therefore illustrate by example and without limitation an exemplary MEMS accelerometer 10 as a miniature structure fabricated from a substrate 12 of semiconductor material by conventional micromachining techniques. The substrate 12 is formed of a monocrystalline silicon material in a substantially planar structure, i.e., having substantially planar and parallel opposing offset upper and lower surfaces. The silicon substrate 12 often includes an upper silicon or active layer 14 that is electrically isolated from an underlying substrate 16 by an insulating layer 18, or an insulating layer is applied to active layer 14, as shown and described in U.S. Pat. No. 5,948,981, Vibrating Beam Accelerometer, issued Sep. 7, 1999, and assigned to the Assignee of the present application, the entirety of which is incorporated herein by reference. The insulating layer 18 is may be a thin layer, e.g., about 0.1 to 10.0 micrometers, of an oxide, such as silicon oxide. The silicon substrate 12 is usually formed by oxidizing active layer 14 and underlying substrate 16, and adhering the two layers together. A portion of active layer 14 may be removed to bring the layer 14 to the desired thickness. The silicon oxide layer 18 retains its insulating properties over a wide temperature range to ensure effective mechanical resonator performance at high operating temperatures on the order of 100 degrees Celsius. In addition, the insulating layer 18 inhibits undesirable etching of the active layer 14 during manufacturing.

Figure 1A:
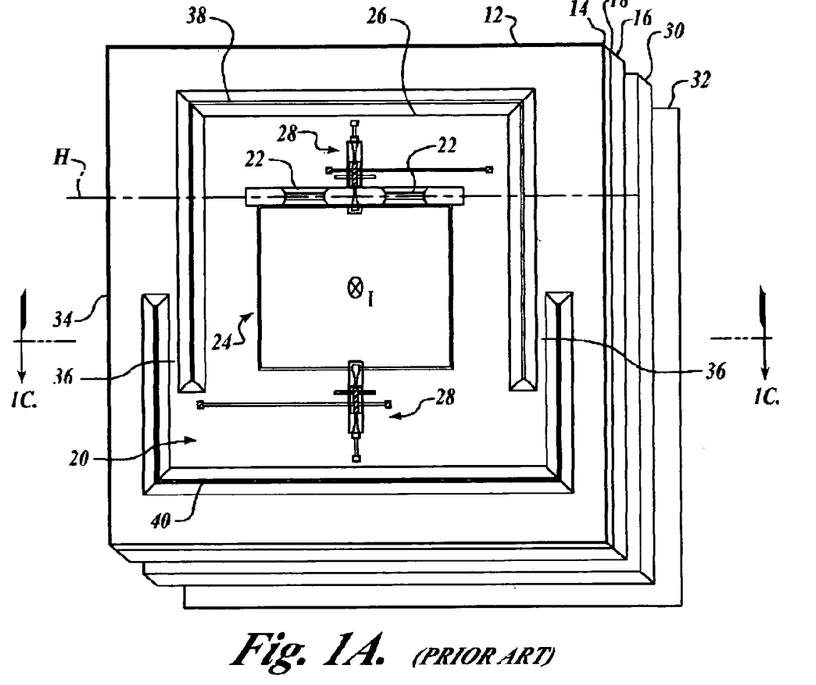
FIG. 1A is a plan view of the accelerometer.

The micromachined accelerometer 10 includes an acceleration sensing mechanism 20 having one or more flexures 22 pliantly suspending a proof mass 24 from an inner sensor frame or plate 26 for movement of the proof mass 24 along an input axis I normal to the proof mass 24. The flexures 22 are preferably etched near or at the center of the underlying substrate 16, i.e., substantially centered between the opposing upper and lower surfaces of the underlying substrate 16. Optionally, the flexures 22 are formed by anistropically etching in a suitable etchant, such as potassium hydroxide (KOH). The flexures 22 define a hinge axis H about which the proof mass 24 moves in response to an applied force, such as the acceleration of the accelerated body, for example, a vehicle, aircraft or other moving body having the accelerometer 10 mounted thereon. The sensing mechanism 20 includes a pair of force/displacement sensors 28 coupled between the proof mass 24 and the sensor frame 26 for measuring forces applied to the proof mass 24. The force/displacement sensors 28 are, for example, mechanical resonators formed from the active silicon layer 14 as double-ended tuning fork (DETF) force sensors.

In response to an applied force, the proof mass 24 rotates about the hinge axis H, causing axial forces, either compressive or tensile, to be applied to the mechanical resonators 28. The axial forces change the frequency of vibration of the mechanical resonators 28, and the magnitude of this change serves as a measure of the applied force or acceleration. In other words, the force/displacement sensors 28 measure the applied acceleration force as a function of the displacement of the proof mass 24.

Figure 1B:
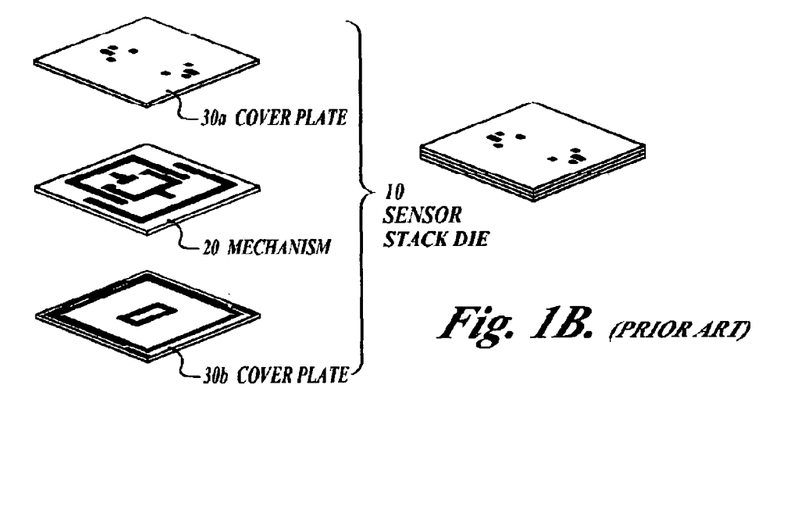
FIG. 1B is an assembly view of the accelerometer shown in FIG. 1A.

Top and bottom cover plates 30a, 30b are used as damping surfaces and shock stop restraints. Undesirable external stresses and strains may be induced in the sensitive acceleration sensing mechanism 20 by mechanical coupling of the accelerometer sensor frame 26 to the pair of top and bottom silicon cover plates 30a, 30b, one of which in turn is typically mechanical coupled to the ceramic or metal mounting plate 32. A major problem consistently confronting the designer of high performance accelerometers relates to supporting the sensing mechanism 20 without locally introducing additional error sources due to discontinuities at the interface between the accelerometer sensor frame 26 and the cover plate 30. These discontinuities are typically introduced in the form of bonding agents or fasteners formed of a different material from that of the sensing mechanism 20.

The available bonding agents, such as epoxy or a glass frit, exhibit thermal expansion coefficients substantially different from that of the silicon substrate of which the sensing mechanism 20 is formed. The bonding agents are usually cured at elevated temperatures, which results in an internal stress condition between the silicon and the bond joints. The bonding agents also exhibit other different physical characteristics that combine to produce localized stress and mechanical hysteresis at the interface. The localized stresses and mechanical hysteresis must be isolated from the sensor mechanism to prevent errors in the sensing function. Any strains occurring in the sensor frame 26 are transmitted not only to the proof mass 24, but through the proof mass 24 to the two DETF resonators 28. Since the only significant compliance in the system is the sensing DETF resonators 28 themselves, almost the entire strain appears as an error output from the DETF resonators 28. Thus, undesirable errors are generated in the DETF resonators 28 from inputs having nothing to do with the acceleration being measured. These errors can be quite large since the compliance through the DETF resonators 28 must be low to detect acceleration with sufficient accuracy to be useful in practical systems.

Strain isolation within the micro-machined accelerometers is thus of paramount importance for good performance, i.e., accuracy. Strain isolation separates the mechanism from stresses mechanically induced during fabrication and assembly, and thereby reduces variations in resonance within the beams of the two vibrating-beam force sensing portions of the accelerometer mechanism. Strain isolation also separates the mechanism from stresses externally induced by shock, vibration and temperature variation within the operating environment.

Many methods are known for isolating the sensitive acceleration sensing mechanism 20 from such undesirable stresses and strains. Typically, the acceleration mechanism is suspended on a frame and the cover bond joints are formed on a peripheral rim connected to the frame with suspension beams. For example, cantilever-style isolation is provided wherein the sensor frame 26 is suspended from a second outer or external frame portion 34 by flexures 36 formed by overlapping slots 38 and 40 through the substrate 12. The sensor frame 26 is thus able to move relative to the outer frame 34, as shown and described in U.S. Pat. No. 5,948,981, which is incorporated herein. Such isolation minimizes the distortion of the sensor frame 26, and thereby decreases the effects of external stresses and strains on the mechanical resonators 28.

FIG. 1B illustrates assembly of a die stack, whereby the top and bottom cover plates 30a, 30b are bonded to the second outer or external frame portion 34 along their peripheral edges to form the completed accelerometer 10, commonly referred to as a "die stack." Top and bottom cover plates 30a, 30b are used as damping surfaces and shock stop restraints. The accelerometer or die stack 10 in turn is typically adhesively connected to the ceramic or metal mounting plate or a header 32 with appropriate drive electronics attached to form the completed accelerometer.

Figure 1C:
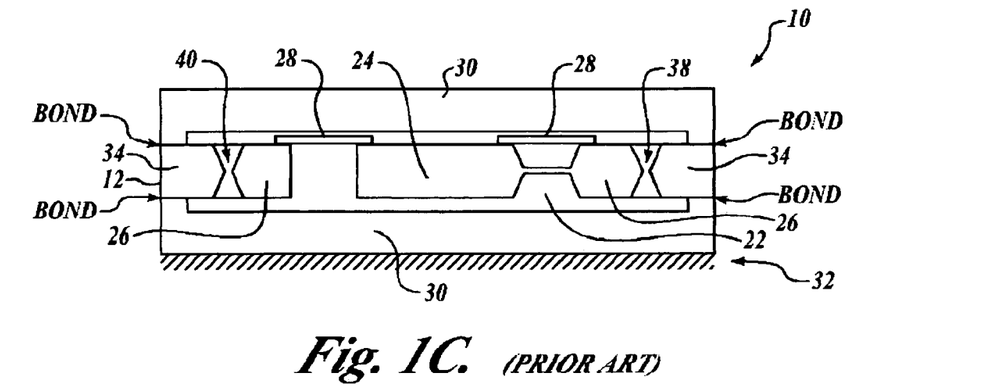
FIG. 1C is a cross-section view of the accelerometer shown in FIG. 1A.

FIG. 1C is a cross-section view taken through the micro-machined accelerometer 10 along the resonators 28. As discussed above and shown in the Figures, the proof mass 24 is free to rotate about the flexures 22 when subjected to acceleration along the input axis I according to the principle of Newton's law: F=ma. This rotation is constrained by the action of two force/displacement sensors 28, shown as DETF resonators, positioned on a surface of the mechanism as shown. These two vibrating beam force sensors 28 provide push-pull variable frequency output signals since, when the proof mass 24 is displaced relative to the plane of the sensing mechanism 20, one DETF resonator 28 is under compression while the other is under tension. The difference between the two frequencies represents the measured acceleration. Common mode frequency shifts, on the other hand, are rejected as errors driven by unwanted sources such as temperature, mechanism stress, or drift.

As illustrated in FIG. 1C, the top and bottom cover plates 30a, 30b are bonded to the second outer or external frame portion 34 along their mutual edges to form the completed accelerometer or die stack 10. The inner sensor frame or plate 26 having the proof mass 24 suspended therein is thereby suspended in turn between the top and bottom cover plates 30a, 30b by the flexures 36. FIGS. 1A-1C thus demonstrate the cantilever-style isolation provided by the prior art.

Figure 1D:
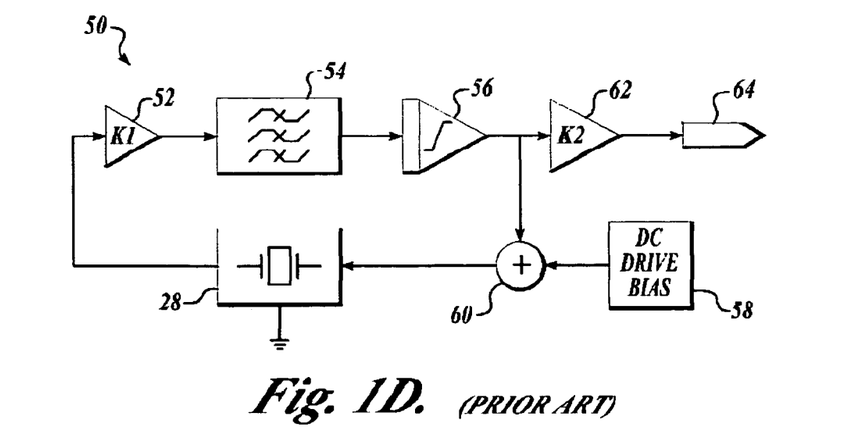
FIG. 1D is a known oscillator circuit for operating the accelerometer shown in FIG. 1A.

A known oscillator circuit, shown in FIG. 1D and described in above-incorporated U.S. Pat. No. 5,948,981, drives the mechanical resonators 28 at their resonance frequency. FIG. 1D illustrates a representative oscillation circuit 50 in which vibrating beams of the transducers 28 function as a resonator. A transimpedance amplifier 52 converts a sense current received from vibrating beams to a voltage. This voltage is filtered by a bandpass filter 54, which reduces noise, and the voltage amplitude is controlled by an amplitude limiter 56. The resulting signal is combined with the output or DC bias voltage from a DC source 58 in a summing junction 60. The DC bias voltage generates a force between electrodes and the beams of the force/displacement sensors 28. The signal from amplitude limiter 56 modulates this force causing the beams of the transducers 28 to vibrate laterally at their resonant frequency. This lateral beam motion, in turn, generates the sense current. An output buffer 62 isolates the oscillator from external circuitry connected to an output 64 of oscillation circuit 50. The gain in oscillation circuit 50 sustains oscillation of the beams of the force/displacement sensors 28.

Prior art MEMS designs have effectively used the cantilever-style strain isolation, new applications continually reduce the space available for the accelerometer. New constraints are placed upon the space available within the accelerometer for strain isolation. These new space constraints do not permit the cantilever-style strain isolation of the prior art. Accelerometer designers are thus challenged in providing sufficient strain isolation within minimum spacing.

Figure 2A:
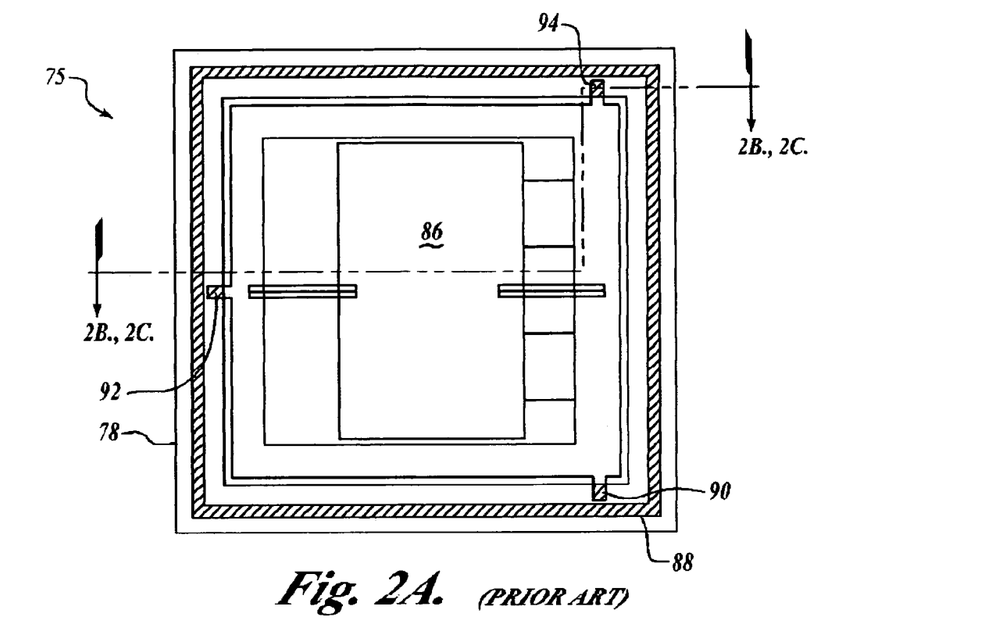
FIG. 2A is a plan view of the accelerometer.
Figure 2B:
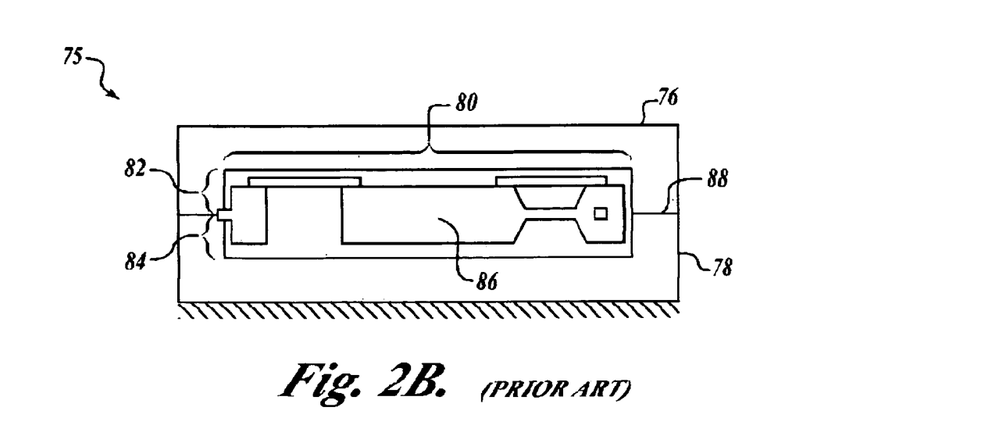
FIG. 2B is a cross-section view of the accelerometer shown in FIG. 2A.
Figure 2C:
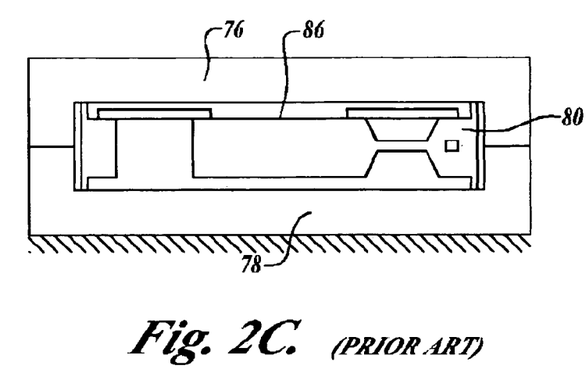
FIG. 2C illustrates an alternative embodiment of the strain isolation technique illustrated in FIGS. 2A and 2B.

FIGS. 2A, 2B and 2C illustrate one effective strain isolation technique. The strain isolation technique disclosed by U.S. Pat. No. 6,301,966, CLAMSHELL COVER ACCELEROMETER, issued Oct. 16, 2001, to the inventor of the present invention and assigned to the Assignee of the present application, the complete disclosure of which is incorporated herein by reference, provides a direct reduction of driving stress and improved isolation by replacing conventional cover plates with "clamshell" cover plates, whereby that the sensing mechanism is housed within the cover plates. A single cover-to-cover bond on the centerline of the cover plate bonding areas bonds the plates to each other. Bonds for securing the sensor mechanism are optional. If present, the sensor mechanism bonds are localized and isolated from the sensing mechanism. Thus, the clamshell design solves the problem of internal stresses more effectively and less expensively than other prior art isolation structures.

FIGS. 2A-2C illustrate the strain isolation technique of U.S. Pat. No. 6,301,966 that eliminates the cantilever-style strain isolation and the second outer or external frame and the cantilever-style flexures 36 suspending the sensor frame 26 and the sensitive acceleration sensing mechanism 20, as illustrated in FIGS. 1A-1D. FIGS. 2A and 2B illustrate the clamshell accelerometer 75 having a pair of clamshell cover plates 76 and 78 structured to accommodate an accelerometer/sensing mechanism 80. The clamshell cover plates 76 and 78 include deeply etched cavities 82 and 84, respectively, that permit motion of the accelerometer's proof mass 86 and provide space for the entire sensing mechanism 80. The sensing mechanism 80 is thus entirely enclosed inside the cover plates 76 and 78, with the cover plates 76 and 78 bonded directly to each other by a centerline bond 88. Small tabs 90, 92 and 94 on the sensing mechanism 80 are bonded to the cover plates 76 and 78. The bonds at tabs 90, 92 and 94 are very small, localized and positioned for minimum sensor impact.

The single centerline bond 88 between the cover plates 76 and 78 reduces cover bonding to a single joint and half the bond material, which directly reduces the driving stress. The clamshell cover-to-cover centerline bond 88 also eliminates mismatch between top and bottom bond joints that will otherwise warp the sensing mechanism out of plane.

However, while the clamshell cover invention of U.S. Pat. No. 6,301,966 markedly improves strain isolation, the sensing mechanism 80 must still be constrained within the confines of the clamshell cover plates to avoid large bias and scale factor errors as well as alignment shifts. One constraint mechanism is limiting the amount of bonding agent at the selected localized sites between the cover plates and the sensing mechanism. Unfortunately, even small amounts of bonding agent introduces an undesirable contact with foreign material at the sensing mechanism interface.

Alternatively, the bond points 90, 92 and 94 may be replaced by contact pressure holding the sensing mechanism 80 in place between the clamshell covers 76 and 78, as illustrated in FIG. 2C.

However, the clamping force required to constrain the sensing mechanism through friction at the interface requires impractically high tolerances while also placing undue stress on the sensing mechanism. Furthermore, large clamping forces will also impact performance and long term drift as the stress relieves over time and environmental exposure.

Accelerometer and other MEMS device designers thus to be challenged in providing effective strain isolation within minimum spacing.

SUMMARY OF THE INVENTION

For purposes of laying a background for the present invention, one typical example of a prior art micro-machined electromechanical system (MEMS) device was provided to illustrate the common cantilever-style strain isolation device of the prior art. However, while the flexible suspension strain isolation device of the present invention as discussed herein is practicable with the exemplary device, the present invention will be further understood to be similarly practicable in other crystalline materials that react similarly to crystalline silicon when exposed to different conventional MEMS manufacturing techniques.

The present invention overcomes the limitations of the prior art for providing effective strain isolation within minimum spacing by providing an apparatus for flexibly suspending a sensing mechanism between a pair of cover plates, the apparatus being a MEMS device having a sensing mechanism formed in a crystalline silicon substrate; a pair of "clamshell" cover plates formed in crystalline silicon substrates with each having a cavity formed by a base and a wall extended along the edges of the base, the walls of the pair of cover plates interconnected along a centerline of the sensing mechanism to form a cavity for housing the sensing mechanism; a first plurality of complementary interfaces in between the sensing mechanism and a first one of the cover plates and fixed relation thereto; a second plurality of complementary interfaces flexibly suspended between the sensing mechanism and the base of a second one of the cover plates, one or more of the flexibly suspended interfaces being a complementary male and female interface; and an adhesive bond joining the walls of the pair of cover plates to enclose the sensing mechanism.

According to another aspect of the invention, one or more of the flexibly suspended complementary interfaces is flexibly deflectable away from the sensing mechanism for exerting a preload on the sensing mechanism.

According to another aspect of the invention, at least a subset of the first plurality of the complementary interfaces are formed as mesas interfacing with complementary flats. Three of the mesa portions of the complementary interfaces optionally form an absolute reference plane for orienting the sensing mechanism relative to the covers.

According to another aspect of the invention, the plurality of flexibly suspended complementary interfaces are either male or female attributes etched in a regularly distributed pattern across a surface of the sensing mechanism in juxtaposition to complementary female or male attributes etched in the base of the second cover plate.

According to another aspect of the invention, among the plurality of flexibly suspended complementary interfaces one or more of the plurality of complementary male attributes is formed as a truncated male projection and the complementary female attribute is formed as a mating socket or indentation.

According to still other aspects of the invention, the present invention provides different methods for strain isolating a micro-machined sensing mechanism in a micro-machined electromechanical system (MEMS) device, one of the methods including forming a micro-machined electromechanical sensing mechanism in a substantially planar crystalline substrate; forming a pair of cover plates in a pair of substantially planar crystalline substrates, each of the cover plates having a cavity formed by a base and an upright wall along the edges of the base, each cavity being sized to partially admit the sensing mechanism and the walls being interconnected along a centerline of the sensing mechanism to form a cavity sized for housing the sensing mechanism; forming in the sensing mechanism and in a first of the cover plates a plurality of complementary interfaces positioned between the sensing mechanism and of the first cover plate and in fixed relationship thereto; forming in the sensing mechanism and in a second of the pair of cover plates a plurality of complementary male and female interfaces flexibly suspended between the sensing mechanism and the second cover plate by etching of a {1,0,0} surface of the crystalline substrate with potassium hydroxide (KOH) or another suitable anisotropic etchant; and interconnecting the pair of cover plates by adhesive bonding along a centerline of the sensing mechanism.

According to another aspect of the invention, one method of forming the complementary male and female interfaces by etching of a {1,0,0} surface of the crystalline substrate further includes etching a truncated pyramid shaped male projection in either the sensing mechanism or the second cover plate. The method also includes etching a complementary female socket in either the sensing mechanism or in the second cover plate. The complementary female socket is etched in the sensing mechanism when the truncated pyramid shaped male projection is formed in the second cover plate, and complementary female socket is etched in the second cover plate when the truncated pyramid shaped male projection is formed in the sensing mechanism.

According to another aspect of the invention, one method of forming the plurality of complementary male and female interfaces flexibly suspended between the sensing mechanism and the second cover plate includes forming a flexible suspension bracket at each of the complementary male and female interfaces for flexibly suspending the complementary interfaces.

According to still another aspect of the invention, one method of the invention includes generating a preload between the sensing mechanism and the second cover plate at one or more of the flexibly suspended complementary interfaces.

According to another aspect of the invention, the plurality of complementary interfaces positioned between the sensing mechanism and the first cover plate and in fixed relationship thereto are produced by forming a plurality of complementary plateau-to-flat interfaces between the sensing mechanism and the first cover plate in fixed relationship to either the sensing mechanism or the first cover plate. Optionally, the method of forming a plurality complementary plateau-to-flat interfaces also includes generating an absolute reference plane defined by end surfaces of the plateau portion of the plateau-to-flat interfaces.

These and other aspects of the present invention are described below with reference to the drawings.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1A, 1B, 1C and 1D illustrate a typical example of a prior art micromachined two-sensor/single proof mass accelerometer having cantilever-style strain isolation, wherein

FIGS. 2A, 2B and 2C illustrate one effective strain isolation technique of the prior art, wherein

FIGS. 7 and 8 illustrate by example and without limitation the flexible suspension apparatus of the invention embodied as a plurality of thin "Z" shaped flexures or flexible suspension brackets formed in a sensing mechanism, wherein FIGS. 9 and 10 illustrate by example and without limitation the flexible suspension apparatus of the invention embodied in a sensing mechanism as a plurality of thin "Z" shaped flexible suspension brackets, wherein

DETAILED DESCRIPTION OF PREFERRED EMBODIMENT

In the Figures, like numerals indicate like elements.

The present invention is an apparatus and method for flexibly suspending an acceleration sensing mechanism between a pair of "clamshell" cover plates, the apparatus including: a sensing mechanism; a pair of "clamshell" cover plates each having a cavity formed by a base and a wall projecting along the edges of the base, the walls of the cover plates interconnected along a centerline of the sensing mechanism to form a cavity for housing the sensing mechanism; and a plurality of complementary interfaces flexibly suspended between the sensing mechanism and the base of each of the cover plates, one or more of the interfaces between the sensing mechanism and one of the cover plates further comprising a male pyramid projection and a complementary female socket indentation.

Figure 3:
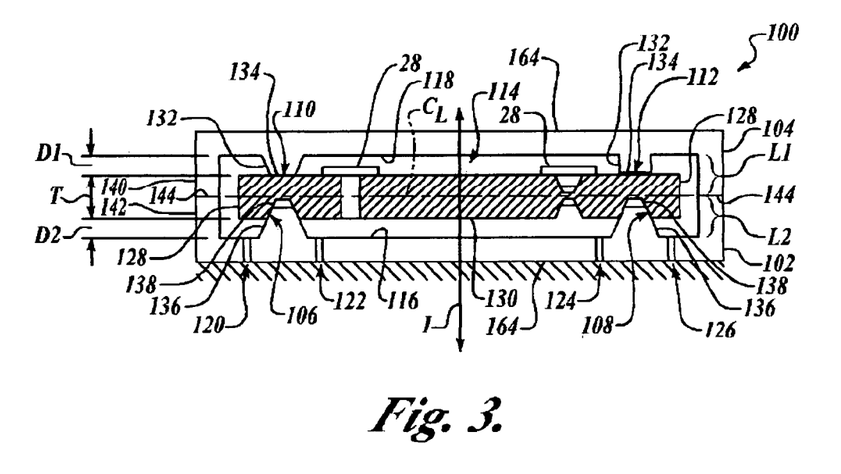
FIG. 3 is a cross-sectional view of an accelerometer of the invention that illustrates by example and without limitation the socket suspension apparatus of the invention embodied as a "pyramid" socket suspension apparatus for providing strain isolation.

FIG. 3 illustrates by example and without limitation the socket suspension apparatus of the invention embodied as a "pyramid" socket suspension apparatus for providing strain isolation in a clamshell accelerometer while avoiding the cantilever-style strain isolation of the prior art. FIG. 3 is a cross-sectional view of a clamshell accelerometer 100 that utilizes clamshell cover plates 102, 104, as disclosed in U.S. Pat. No. 6,301,966, which is incorporated herein by reference, in combination with the socket suspension apparatus of the invention embodied as a plurality of complementary interfaces 106, 108, 110, 112 each flexibly suspended between a sensing mechanism 114 and a base portion 116, 118 of the respective cover plates 102, 104.

As embodied in FIG. 3, the 110, 112 are etched in the base portion 118 of the cover plate 104 and provide an absolute reference plane for locating the sensing mechanism 114. In contrast, the interfaces 106, 108 are flexibly suspended between the sensing mechanism 114 and the base 116 of one of the cover plates 102. For example, as discussed in detail below, pairs of slots 120, 122 and 124, 126 isolate the respective interfaces 106, 108 from the cover plate 102. Alternatively, paired slots are formed in a frame portion 128, from which a proof mass 130 of the sensing mechanism 114 is flexibly suspended, for isolating the respective interfaces 106, 108 from the cover plate 102. The slots 120, 122 and 124, 126 permit the interfaces 106, 108 to "float" and thereby decouple the sensing mechanism 114 from strains in the cover plates 102, 104 that otherwise may be transmitted through the interfaces 106, 108, 110, 112.

The interfaces 106-112 are thus of two types. The interfaces 110, 112 are each provided with a flat tipped male or "plateau" projection 132 sized to abut and interface with a complementary flat 134 on a corresponding surface of the sensing mechanism frame 128. The male projections 132 are etched into the inside surface 118 of the cover plate 104 at locations corresponding to a surface of the sensing mechanism frame 128 from which the proof mass 130 is suspended. The male plateau projections 132 are truncated a set distance away from or "above" the surrounding cover material. The male plateau projections 132 thus serve to space the sensing mechanism 114 a prescribed stand-off distance D1 away from the internal surface of the cover base 118. The spacing of the sensing mechanism 114 is far enough from the surface of base 118 for the proof mass 130 to rotate, but the spacing is close enough for the surface of base 118 to operate as a damping surface and shock stop restraint.

In the exemplary embodiment illustrated in FIG. 3, a plurality of the plateau-to-flat interfaces 110, 112 are distributed in a regular pattern at spaced apart locations to provide balanced support of the sensing mechanism 114. The distributed plateau-to-flat interfaces 110, 112 also provide an absolute reference plane for orienting the sensing mechanism 114 relative to the cover 104.

The interfaces 110, 112 occur at the abutment of the male plateau projection 132 and the complementary flat 134, as such configuration of the side wall surfaces of the plateau projections 132 may be pyramidal (shown at 110) as results from etching of a {1,0,0} crystalline surface, as discussed below. Alternatively, the plateau projections 132 may be more perpendicular (shown at 112) as results from using Reactive Ion Etching (RIE) or Deep Reactive Ion Etching (DRIE), which permit etching of nearly vertical walls. In other words, as the side walls of the plateau projections 132 do not form any part of the interface 110, 112, their configuration is irrelevant to the present invention.

The interfaces 106, 108 are of a second type formed of a male projection 136, commonly known as a "mesa," and a complementary female indentation or socket 138. The male projection or mesa 136 is formed on either the internal surface of the base 116 of the cover 102 (shown in FIG. 3) or on the corresponding surface of the sensing mechanism frame 128 (discussed below).

The complementary female indentation or socket 138 is formed on the corresponding surface of the other part, i.e., the sensing mechanism frame 128 or the cover base 116, opposite from the projection 136.

The male projection 136 is a truncated "pyramid" shaped locator nubbin, while the complementary female indentation 138 is a mating truncated conical or pyramidal shaped recess. The pyramid shapes of both the male projection 136 and female indentation 138 result from etching of a {1,0,0} silicon surface with a suitable anisotropic etchant, where the silicon surface is defined using the well-known Miller indices for crystal structure. While the etching may be accomplished using an extremely preferential etchant, such as potassium hydroxide (KOH), other suitable anisotropic enchants are generally well-known and may be substituted with useful results. The pyramid shapes of both the male projection 136 and female indentation 138 are thus based on the preferred etching characteristic of crystalline silicon and other crystalline wafer materials. The socket suspension apparatus of the invention can be practiced with other crystalline materials that behave similarly, silicon is thus discussed here by example and without limitation on the applicability of the invention to other crystalline materials.

Figure 4:
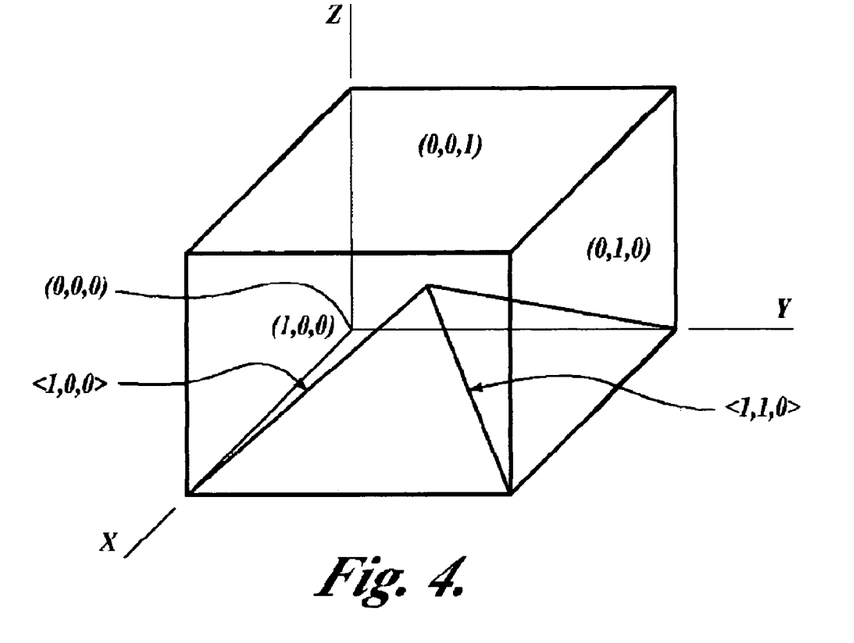
FIG. 4 illustrates the common fabrication process for micro-machined electromechanical sensor (MEMS) devices by anisotropic etching of various features.

FIG. 4 illustrates the common fabrication process for micro-machined electromechanical sensor (MEMS) devices by etching of various features in crystalline silicon or other crystalline wafer material using a suitable anisotropic etchant such as KOH. By aligning the sides of a mask along the <1,1,0> directions of a {1,0,0} silicon surface, etching in KOH proceeds quickly in the <1,0,0> directions of the silicon wafer. The KOH etching is confined by virtually non-etching {1,1,1} side walls, which intersect with the silicon wafer surface at an angle of 54.74 degrees along the <1,1,0> oriented mask edges. In the case of a dark field mask, rectangular cavities are formed with {1,1,1} side-walls and a {1,0,0} bottom surface. In the opposite case of a clear field mask, etching results in mesa type structures with {1,1,1} sidewalls. In the latter case, compensation structures are added to the mask corners to preserve sharp or controllably rounded convex corners. These compensation structures allow sacrificial etching in KOH until the desired mesa shape is defined. This inherent etching behavior produces non-vertical sidewalls that slope very precisely along the lines of the 54.74 degree angle of the atomic lattice. The result of this sloped etching is generally an unwanted feature that demands extra real estate and limits the feature resolution that can be obtained.

The socket suspension apparatus of the present invention takes advantage of this characteristic behavior. Accordingly, the female indentations or socket holes 138 are purposely etched at appropriate locations into one surface of the frame portion 128 of the sensing mechanism 114 (shown in FIG. 3) or into the base portion 116 of the cover 102 (discussed below). The male projections 136 are etched into the cover plates (FIG. 3) or sensing mechanism frame 128 (discussed below) at corresponding locations. Since the etched slopes follow the atomic lattice, they are extremely precise and substantially identical for both male projections 136 and sockets 138.

The male projection 136 and female indentation 138 illustrated in FIG. 3 are complementarily sized so that the tip of the male projection 136 enters into opening of the female indentation 138, but exterior walls of the male projection 136 interface with the interior surfaces of the female indentation 138 before the base of the male projection 136 enters the opening in the female indentation 138. The interface of the male projection 136 with the female indentation 138 thereby space the sensing mechanism 114 a prescribed stand-off distance D2 away from the internal surface of the base 116. The interface of the male projection 136 surfaces with the interior surfaces of the female indentation 138 also serve to center the male projection 136 within the female indentation 138. Truncation of the tip of the male projection 136 ensures that the male projection 136 does not "bottom out" against the truncated end of the female indentation 138 before the mutual exterior and interior surfaces interface.

The male projections 136 and complementary female indentations 138 thus serve to both locate the sensing mechanism 114 in relative alignment to the cover 102 and to space the sensing mechanism 114 a set distance away from the internal surface of the base 116. The spacing of the sensing mechanism 114 is far enough from the surface of base 116 for the proof mass 130 to rotate, but the spacing is close enough for the surface of base 116 to operate as a damping surface and shock stop restraint.

The spacings D1 and D2 are sized to locate the centerline $C_L$ of the sensing mechanism 114 even with the tops of the walls 140, 142 projecting along the edges of the respective base portions 116, 118 when the clamshell covers 102, 104 are assembled around the sensing mechanism 114. This eliminates the moment arm through which a bond joint 144 between the covers 102, 104 can act to bend or warp the sensing mechanism 114.

Inside lengths L1 and L2 of the walls 140 and 142 of the respective clamshell covers 102, 104 are sized to complement the sensing mechanism 114. The resulting stand-off distances D1, D2 are thus adjusted in cooperation with the thickness T of the sensing mechanism 114 to space the walls 140, 142 a predetermined amount such that a predetermined bond line is provided for the bond joint 144. The sizing of the inside wall lengths L1, L2, the sensing mechanism thickness T and the stand-off distances D1, D2 may be selected such that a desired amount of preload is applied at the interfaces 106-112 when the bond joint 144 is formed. The preload is selected to constrain the sensing mechanism 114 within the confines of the clamshell cover plates 102, 104 and thereby avoid bias and scale factor errors as well as alignment shifts.

The flexible suspension of the complementary interfaces 106, 108 overcomes the impractically high tolerances required in the prior art to constrain the sensing mechanism through friction at the interface. The etched slopes are inherently extremely precise and, in pure silicon, may be nearly flawless. When assembled, the male pyramid projections 136 fit into the female sockets 138 with nearly perfect precision. This precision fit causes the silicon-to-silicon interfaces 106-112 to be both stable and extremely resistant to lateral displacements. No bonding agent is required at the interface.

Since the joint no longer relies on friction for its stability, the clamping force is reduced to only that needed to prevent vertical separation under anticipated environments. The flexible suspension however also eliminates any impact that clamping forces would normally have on performance and long term drift as the stress relieves over time and environmental exposure. Thus, the socket suspension apparatus of the invention operates to maximize whatever performance may be inherent in the supported sensing mechanism. The socket suspension apparatus of the invention also enhances the action of the optional clamshell cover plates when combined in a common design.

Figure 5:
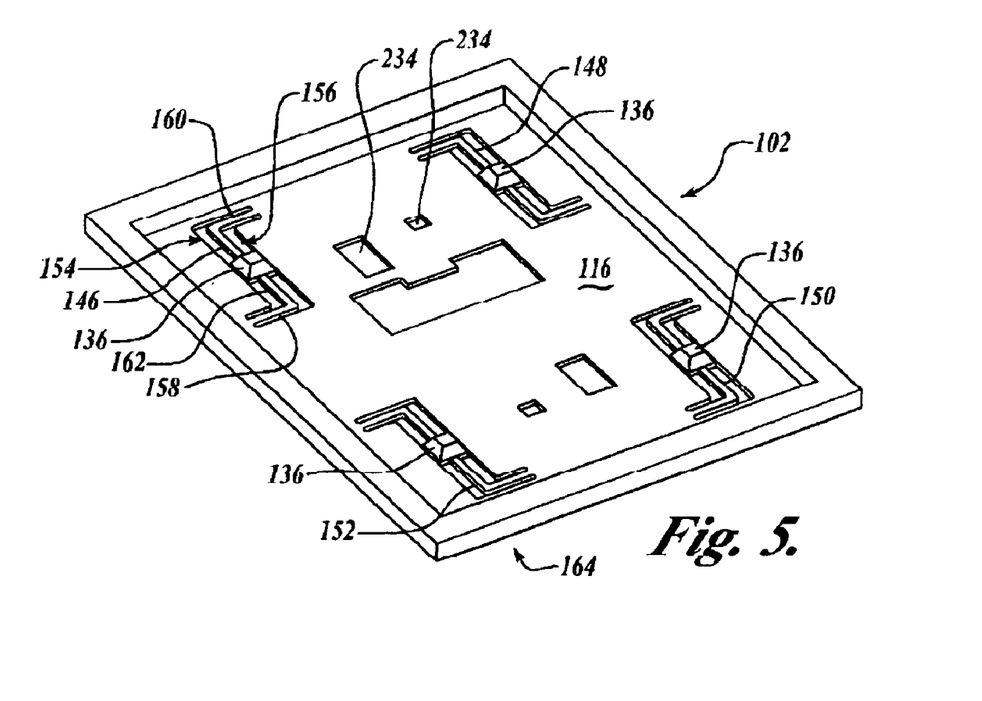
FIG. 5 is an exemplary view that illustrates by example and without limitation an inside surface of a sensor cover embodying one embodiment of the flexible suspension of the complementary interfaces of the invention.

FIG. 5 illustrates by example and without limitation one embodiment of the flexible suspension of the complementary interfaces 106, 108. Accordingly, FIG. 5 illustrates a plurality of thin "Z" shaped flexures or flexible suspension brackets 146, 148, 150 and 152 formed in the base portion 116 of the clamshell cover 102. The Z-shaped flexible suspension brackets 146, 148, 150, 152 are formed by pairs of Z-shaped slots 154, 156 (shown for suspension bracket 146) that define pairs of bars 158, 160 at opposite ends of elongated stems 162 and isolate the respective suspension brackets 146-152 from the cover plate 102. The male projections or mesas 136 are formed on the suspension brackets 146-152 midline of the respective stems 162.

The thin "Z" shape of the suspension brackets 146-152 may be formed using Reactive Ion Etching (RIE) or Deep Reactive Ion Etching (DRIE), which permit etching of nearly vertical walls. In other words, the side walls of the suspension brackets 146-152 are formed as substantially vertical walls, which permits the Z-shaped slots 154, 156 to be very narrow and the suspension brackets 146-152 to be very clearly defined.

The thin "Z" shape of the suspension brackets 146-152 permits deflection of the male projections 136 in 3 axes: the pairs of bars 158, 160 at the ends of the stems 162 permit flexion of the suspension structures 146-152 along the stems 162, while the elongated structure of the stems 162 permit columnar flexion crosswise to its longitudinal axis, and the pairs of bars 158, 160 operate in concert with the elongated stems 162 to permit flexion out of the plane of the base portion 116 of the cover 102. The 3-axis flexion of the suspension brackets 146-152 permits the male pyramid projections 136 to shift position relative to the cover 102 to accommodate misalignments with the female socket indentations 138 when the sensing mechanism 114 is assembled with the cover 102.

In the exemplary embodiment illustrated in FIG. 3, two or more of the pyramid-to-socket interfaces 106, 108 are provided in the cover 102. The multiple pyramid-to-socket interfaces 106, 108 are sufficient for locating the sensing mechanism 114 relative to the cover 102, as shown. In theory, two of the pyramid-to-socket interfaces 106, 108 are sufficient for constraining the sensing mechanism 114 in-plane relative to the cover 102 when subjected to cross-axis shock and vibration loads.

However, in practice perfect alignment of two of the male pyramid projections 136 with two of the female sockets 138 is unlikely. Therefore, three or more of the pyramid-to-socket interfaces 106, 108 are distributed in a regular pattern at spaced apart locations for locating the sensing mechanism 114 relative to the cover 102. The thin "Z" shape of the suspension brackets 146-152 permits a slight cross-axis deflection by which the male pyramid projections 136 are shifted into alignment with the corresponding female sockets 138. The male pyramid projections 136 are optionally offset slightly relative to the female sockets 138 so that desired facets of each pyramid projection 136 contact corresponding faces of the female sockets 138.

The combination of all of the plateau projections 132 and the preloaded pyramid projections 136 constrain the sensing mechanism 114 out-of-plane relative to the covers 102, 104 when subjected to input axis shock and vibration loads.

Furthermore, when the flexible suspension of the invention is practiced as the plurality of thin "Z" shaped flexible suspension brackets 146-152 illustrated in FIG. 5 and others of the Figures, no specific orientation between the different suspension brackets 146-152 is required. A specific orientation of the different suspension brackets 146-152 relative is not required. The size and shape of the thin "Z" shaped flexible suspension brackets 146-152 causes them to be compliant in both in-plane axes. Therefore, no specific orientation is necessary for the flexible suspension of the invention to operate as intended when practiced as thin "Z" shaped flexible suspension brackets. While the symmetric orientation of the flexible suspension brackets 146-152 illustrated in FIG. 5 may be useful for a particular application, other useful orientations are illustrated in the subsequent Figures.

Figure 6:
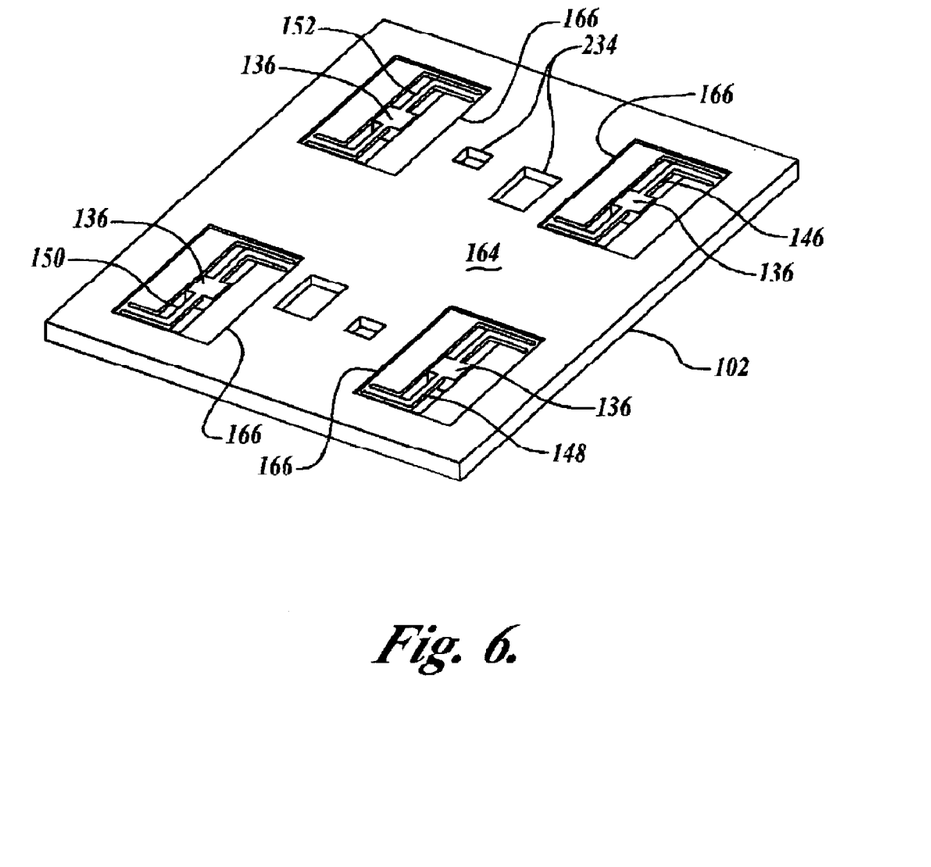
FIG. 6 is an exemplary view showing by example and without limitation an outside surface of a sensor cover embodying one embodiment of the flexible suspension of the complementary interfaces of the invention.

FIG. 6 is an exemplary view of an outside surface 164 of the clamshell cover 102. By example and without limitation, a portion 166 of the outside surface 164 is relieved in the areas of the pyramid projections 136. The thin "Z" shapes of the suspension brackets 146-152 are thereby made thinner and more flexible along the input axis I of the sensing mechanism 114. The input axis flexibility permits the individual pyramid projections 136 to shift out-of-plane to accommodate nonplanar characteristics of either or both the sensing mechanism 114 and the individual pyramid and plateau projections 136 themselves. Thus, during assembly the sensing mechanism 114 is able to settle into a stable relationship with the individual pyramid and projections 136.

As discussed above, the inside lengths L1, L2 of the cover walls 140, 142 are sized to complement the sensing mechanism 114 so that the bond joint 144 applies a preload at the interfaces 106-112.

The additional input axis flexibility provided by the relief portions 166 provides an additional preload mechanism. By adjusting the depth of the relief portions 166, the thickness and thus the spring rate of the flexures 146-152 is decreased as a function of the depth of the relief portions 166 from a maximum stiffness that exists when the reliefs 166 are completely eliminated. In other words, as the flexures 146-152 are thinned, their spring rate is decreased, which in turn decreases the applied preload.

Figure 7:
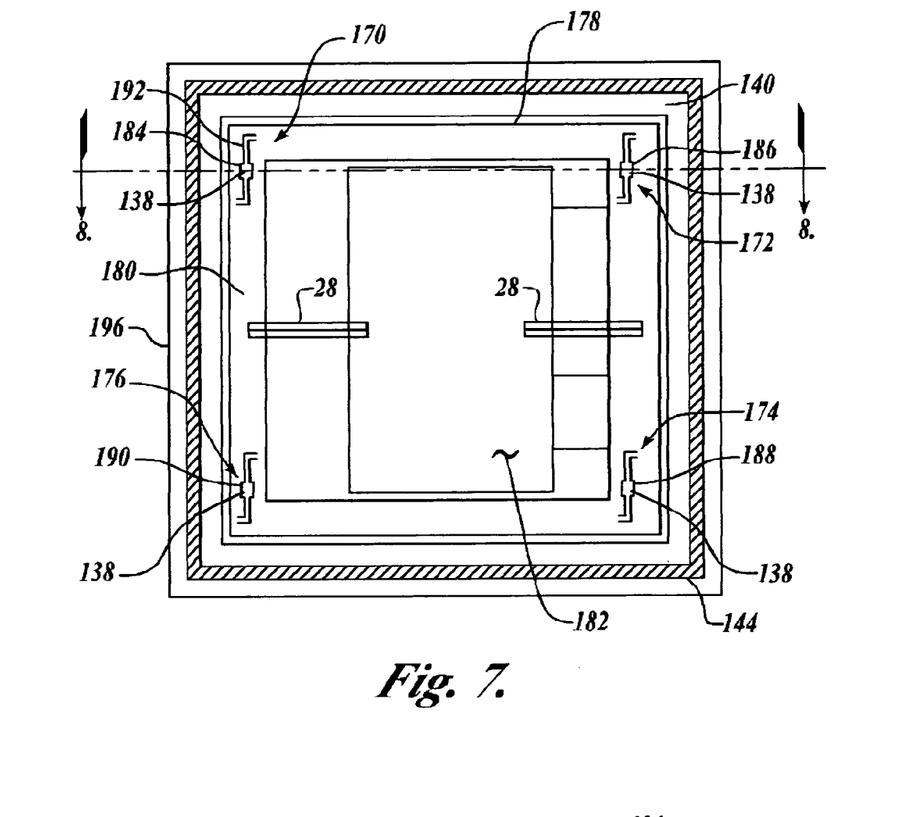
FIG. 7 is a plan view of a accelerometer including the sensing mechanism having the thin "Z" shaped flexible suspension brackets formed therein.
Figure 8:
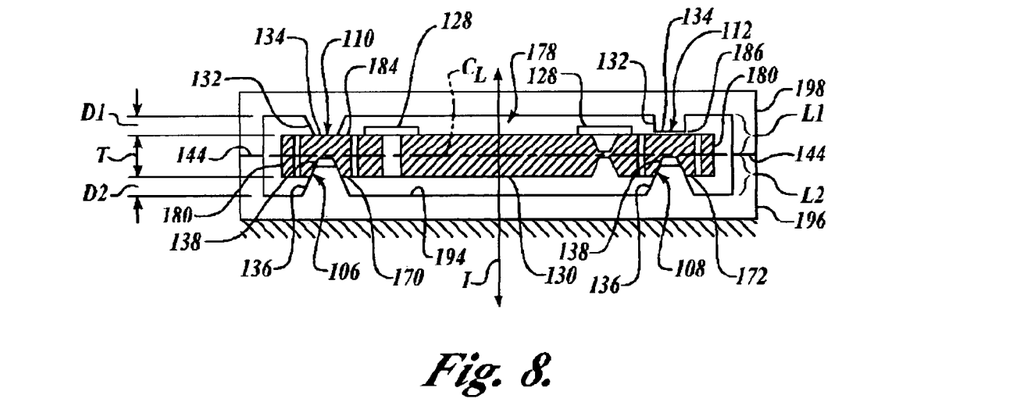
FIG. 8 is a cross-section view of the accelerometer shown in FIG. 7.

FIGS. 7 and 8 illustrate the flexible suspension apparatus of the invention embodied as a plurality of thin "Z" shaped flexures or flexible suspension brackets 170, 172, 174, 176 formed in a sensing mechanism 178. The flexible suspension brackets 170, 172, 174, 176 are formed in a frame portion 180 of the sensing mechanism 178 with a proof mass 182 flexibly suspended therefrom. In the example of FIG. 7, the flexible suspension brackets 170-176 are usefully oriented identically relative to the sensing mechanism frame 180. In one example, each of the flexible suspension brackets 170-176 includes an expanded island portion 184, 186, 188, 190, respectively, which is centrally or symmetrically located along the length of the central elongated stems 192.

The interfaces 106, 108 are formed at the island portions 184-190. For example, each of the island portions 184 is formed with one of the female indentations or sockets 138, discussed above, that complements a male projection or pyramid mesa 136 formed in the base portion 194 of one clamshell cover 196.

As illustrated in FIG. 8, a quantity of the plateau-to-flat interfaces 110, 112 are provided between the sensing mechanism 178 and a top cover 198. Accordingly, flats 134 are formed on the opposite sides of the island portions 184-190 of the respective flexible suspension brackets 170-176 and form interfaces with plateau mesas 132 formed on the base portion 194 of the clamshell cover 196. The plateau mesas 132 each have flat, co-planar surfaces that are truncated a set distance away from or "above" the surrounding material. The plateau mesas 132 thus provide an absolute reference plane relative to the sensing mechanism 178 and further interface with the flats 134 to space the sensing mechanism 178 the prescribed stand-off distance D1 away from the internal surface of the base 194 of the cover 196.

The flexible suspension brackets 170-176 thus flexibly support all of the complementary interfaces 106-112 and decouple the sensing mechanism 178 from strains in the cover plates 196, 198 that otherwise may be transmitted through the interfaces 106-112.

Figure 9:
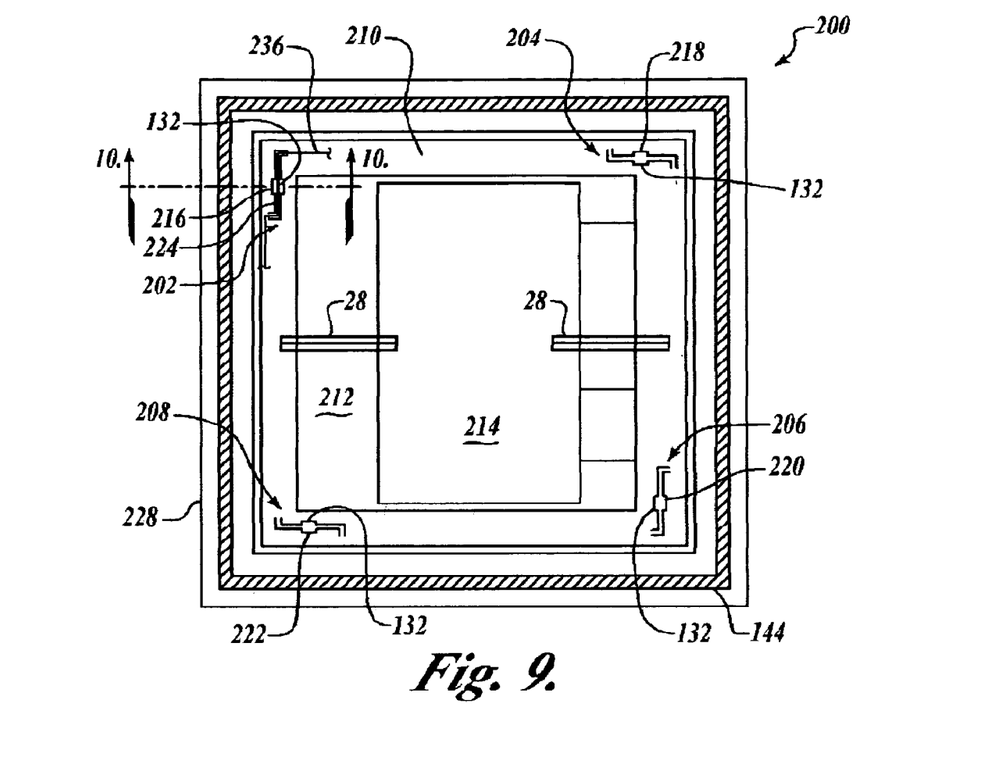
FIG. 9 is a plan view of the of a accelerometer including the sensing mechanism having the thin "Z" shaped flexible suspension brackets formed therein.
Figure 10:
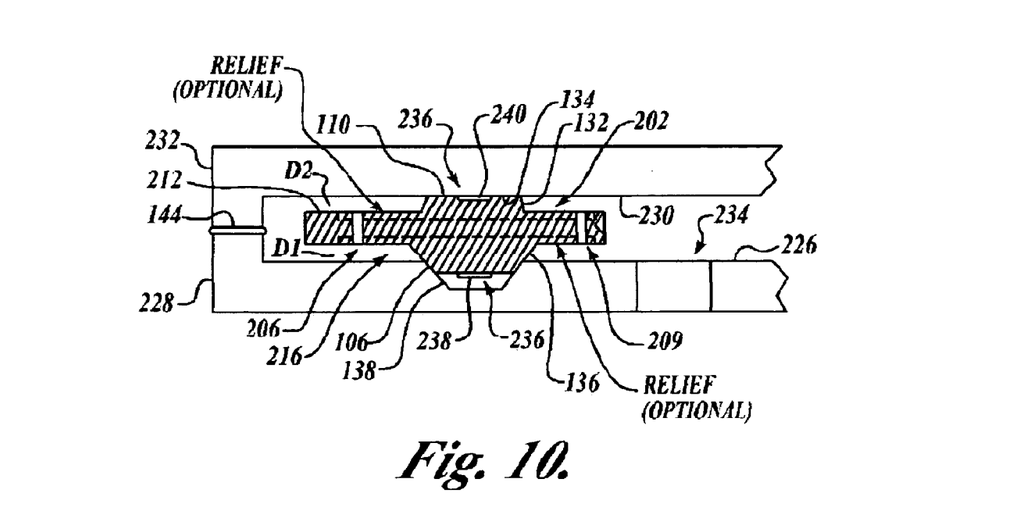
FIG. 10 is a cross-section view of the accelerometer shown in FIG. 9.

FIGS. 9 and 10 illustrate the flexible suspension apparatus of the invention embodied as a sensor 200 having a plurality of thin "Z" shaped flexures or flexible suspension brackets 202, 204, 206, 208 formed by pairs of slots 209 in a sensing mechanism 210. The sensing mechanism 210 includes a frame portion 212 having a proof mass 214 flexibly suspended therefrom. The flexible suspension brackets 202-208 are formed in the frame portion 212 and include expanded island portion 216, 218, 220, 222, respectively, which are centrally or symmetrically located along the length of the central elongated stems 224.

In the example of FIG. 9, each flexible suspension brackets 202-208 is usefully oriented at about 90 degrees relative to the other flexible suspension brackets 202-208.

The pyramid-socket interfaces 106,108 are formed at the island portions 216-222. For example, each of the island portions 216, 218, 220, 222 is formed with a male projection or pyramid mesa 136, while a complementary one of the female indentations or sockets 138 is formed at a corresponding location in a base portion 226 of one clamshell cover 228.

As illustrated in FIG. 10, a quantity of the plateau-to-flat interfaces 110 are provided between the sensing mechanism 178 and a top cover 198. Accordingly, a plateau mesa 132 is provided at each of the island portions 216, 218, 220, 222. These plateau mesas 132 interface with flats 134 formed on the base portion 230 of the top clamshell cover 232. The plateau mesas 132 each have flat, co-planar surfaces that are truncated a set distance away from or "above" the surrounding material of the sensing mechanism frame 212. The plateau mesas 132 thus provide a reference plane relative to the sensing mechanism 210. The plateau mesas 132 also interface with the flats 134 to space the sensing mechanism 210 the prescribed stand-off distance D1 away from the internal surface of the base 230 of the cover 232.

The frame 212 of the sensor mechanism 210 is optionally relieved in the area of the flexible suspension brackets 202-208 to adjust the spring rate exhibited by the flexible suspension brackets 202-208. The frame 212 can be relieved from one or both sides to achieve the desired spring rate for applying a desired preload when the clamshell covers 228, 232 are assembled with the sensing mechanism 210.

The flexible suspension brackets 202-208 thus flexibly support all of the complementary interfaces 106-112 and decouple the sensing mechanism 210 from strains in the cover plates 228, 232 that otherwise may be transmitted through the interfaces 106-112.

Furthermore, by forming the flexible suspension brackets 202-208 of the invention in the sensing mechanism 210, slots for defining the flexible suspension brackets 202-208 are eliminated from the clamshell covers 228, 232. After the covers 228, 232 are joined by the edge seal 144, only a few access windows 234 (also shown in FIGS. 5 and 6) compromise a hermetic seal of the completed sensor 200.

According to one embodiment of the invention, any necessary windows 234 providing access to the mechanism 114 are formed in the cover 104 having the flexible suspension brackets 146-152 formed therein, as illustrated in FIGS. 5 and 6. This optional preference eases manufacturing complexities by providing all through etching in a single cover.

However, forming the flexible suspension brackets 170-176 in the sensing mechanism 178, as illustrated in FIGS. 7 and 8, or by forming the flexible suspension brackets 202-208 in the sensing mechanism 210, as illustrated in FIGS. 9 and 10, provides an opportunity for securing a hermetic seal around the mechanism.

Accordingly, by forming conductive traces 236 over one or more of the flexible suspension brackets 170-176 or 202-208 (shown) to conduct the system power and signals, the access windows 234 are eliminated and a hermetically sealed sensor results. According to one embodiment of the invention, the conductive traces 236 are formed of a conductive metal 238, such as gold, deposited on the surface of the flexible suspension brackets 202-208. According to another embodiment of the invention, the conductive traces 236 are formed by doping the surface of the flexible suspension brackets 202-208 with a suitable conductive dopant. For example, a channel 240 of dopant is diffused into the surface of the semiconductor silicon material of the flexible suspension brackets 202-208. The dopant is a p-type (positive) or n-type (negative) dopant selected as a function of the base material of the selected silicon wafers, typically n-type dopant for forming "n" channels in p-type wafers and p-type dopant for forming "p" channels in a n-type wafers. The n-type surface doping impurity is by example and without limitation: phosphorus, arsenic, or antimony. The p-type surface doping impurity is by example and without limitation: boron, aluminum, gallium, indium, or titanium. The surface doping impurity source can be solid, liquid or gas for ion implantation in a deposition furnace. The surface doping impurity source can only be gas for ion implantation using a vacuum ion accelerator. A mask, such as a quartz mask with opaque and clear areas, is used for respectively blocking and passing ultraviolet light that is utilized in a mask aligner tool for selectively exposing/patterning photo sensitive resist film, commonly referred to as "photoresist," for patterning the silicon wafers.

It is understood that the apparatus of the invention for flexibly suspending a sensing mechanism between a pair of cover plates is not limited to the clamshell cover application described herein. Rather, the pyramid-socket interfaces and plateau-flat interfaces are employed profitably in any mount application having sensor and covers fabricated from the silicon or another crystalline material susceptible to anisotropic etching. Furthermore, as discussed herein, while one typical example of a prior art micro-machined electromechanical system (MEMS) device was provided to illustrate the flexible suspension strain isolation device of the invention, the present invention as discussed herein will be understood to be similarly practicable in any crystalline material that reacts similarly to crystalline silicon when exposed to conventional MEMS manufacturing techniques. Therefore, while the preferred embodiment of the invention has been illustrated and described, it will be appreciated that various changes can be made therein without departing from the spirit and scope of the invention.

What is claimed is:

1. A method for strain isolating a micro-machined sensing mechanism in a micro-machined electromechanical system (MEMS) device, the method comprising:
   in a first crystalline wafer having first and second substantially planer and parallel spaced apart opposing surfaces, forming a micro-machined electromechanical force sensing mechanism having a relatively stationary frame portion substantially surrounding an operational portion;
   in second and third crystalline wafers each having first and second substantially planar and parallel spaced apart opposing surfaces, forming a pair of cover plates;
   mounting the pair of cover plates on either side of the sensing mechanism and interfaced with the frame portion thereof the mounting further comprising:
      interfacing a plurality of flat tipped male projections and complementary flats between the frame portion of the sensing mechanism and the first cover plate,
      flexibility suspending a plurality of male projections and complementary female indentations between the frame portion of the sensing mechanism and the second cover plate, and
      forming a bond joint between the pair of cover plates.

2. The method of claim 1 wherein one of the male projections further comprises a truncated pyramid-shaped projection, and the complementary female indentation corresponding thereto further comprises a mating truncated pyramidal shaped recess.

3. The method of claim 2 wherein each of the truncated pyramid-shaped projection and complementary mating truncated pyramidal shaped recess further comprise substantially identical slopes.

4. The method of claim 3 wherein each of the first, second and third crystalline wafers further comprises an atomic lattice structure, and
   the slopes of each of the truncated pyramid-shaped projection and complementary mating truncated pyramidal-shaped recess substantially follow the atomic lattice structure.

5. The method of claim 3 wherein each of the first, second and third crystalline wafers further comprises crystalline silicon.

6. The method of claim 3 wherein:
   the first cover plate further comprises the plurality of the flat tipped male projections interfaced with the complementary flats;
   the frame portion of the sensing mechanism further comprises the complementary flats;
   the second cover plate further comprises the plurality of the male projections interfaced with the complementary female indentations; and
   the frame portion of the sensing mechanism further comprises the complementary female indentations.

7. The method of claim 3 herein:
   the frame portion of the sensing mechanism further comprises the plurality of the flat tipped male projections interfaced with the complementary flats;
   the first cover plate further comprises the complementary flats;
   the frame portion of the sensing mechanism further comprises the plurality of the male projections interfaced with the complementary female indentations; and
   the second cover plate further comprises the complementary female indentations.

8. The method of claim 3 wherein forming each of the pair of cover plates further comprises forming a cavity formed by a base and a wall extended along the edges of the base; and
   mounting the pair of cover plates further comprises:
      interconnecting the walls of the pair of cover plates along a centerline of the sensing mechanism to form a cavity for housing the sensing mechanism,
      forming the plurality of the flats on the first surface of the sensing mechanism,
      interfacing the plurality of flat tipped male projections with the complementary flats,
      forming the plurality of male projections on the base of the second cover plate,
      forming complementary female indentations on the second surface of the sensing mechanism,
      interfacing the plurality of male projections with the complementary female indentations, and
      joining the walls of the pair of cover plates with a bond joint.

9. A method for strain isolating a micro-machined sensing mechanism in a micro-machined electromechanical system (MEMS) device, the method comprising:
   in respective crystalline silicon substrates, forming a pair of cover plates each having a base surrounded by walls, an inner surface of the base of a first of the cover plates being formed with a plurality of flat tipped male projections, and an inner surface of the base of a second of the cover plates being formed with a plurality of male truncated pyramid-shaped projections having;
   in another a crystalline silicon substrate, forming a micro-machined electromechanical force sensing mechanism suspended from a frame portion thereof, a first surface of the frame portion being formed with a plurality of flats each complementary to one of the plurality of flat tipped male projections formed on the inner surface of the base of the first cover plate, and a second surface of the frame portion being formed with a plurality of female truncated pyramidal-shaped indentations each complementary to one of the plurality of male truncated pyramid-shaped projections formed on the inner surface of the base of the second cover plate;
   interfacing each of the plurality of flats on the first surface of the frame portion of the sensing mechanism with a complementary one of the plurality of flat tipped male projections formed on the inner surface of the base of the first cover plate; and
   interfacing each of the plurality of female truncated pyramidal-shaped indentations formed on the second surface of the frame portion with a complementary one of the plurality of male truncated pyramid-shaped projections formed on the inner surface of the base of the second cover plate.

10. The method of claim 9, wherein forming the plurality of male truncated pyramid-shaped projections formed on the inner surface of the base of the second cover plate further comprises flexibly suspending one or more of the plurality of male truncated pyramid-shaped projections relative to the base of the second of the cover plate.

* * * * *

UNITED STATES PATENT AND TRADEMARK OFFICE
CERTIFICATE OF CORRECTION

| | |
|---|---|
| PATENT NO. | : 7,416,910 B2 |
| APPLICATION NO. | : 11/348584 |
| DATED | : February 6, 2006 |
| INVENTOR(S) | : Foote et al. |

It is certified that error appears in the above-identified patent and that said Letters Patent is hereby corrected as shown below:

On the title page below item (65) and before item (51) please insert the following Item (62):

--Related U.S. Application Data
(62) Divisional of Application No. 10/779,921, filed on February 17, 2004, now Pat. No. 7,073,380.--

Signed and Sealed this

Fifth Day of October, 2010

David J. Kappos
*Director of the United States Patent and Trademark Office*